(12) United States Patent
Wang

(10) Patent No.: US 11,999,511 B2
(45) Date of Patent: *Jun. 4, 2024

(54) PREDICTIVE PART MAINTENANCE

(71) Applicant: THE BOEING COMPANY, Chicago, IL (US)

(72) Inventor: Zhennong Wang, Bellevue, WA (US)

(73) Assignee: THE BOEING COMPANY, Arlington, VA (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/751,647

(22) Filed: May 23, 2022

(65) Prior Publication Data
US 2022/0281618 A1 Sep. 8, 2022

Related U.S. Application Data

(63) Continuation of application No. 16/406,827, filed on May 8, 2019, now Pat. No. 11,338,940.

(51) Int. Cl.
*B64F 5/60* (2017.01)
*G06F 30/20* (2020.01)
(Continued)

(52) U.S. Cl.
CPC ............... *B64F 5/60* (2017.01); *G06F 30/20* (2020.01); *G07C 5/006* (2013.01); *G07C 5/0808* (2013.01); *G07C 5/085* (2013.01)

(58) Field of Classification Search
CPC .......... B64F 5/60; G06F 30/20; G06F 11/008; G07C 5/006; G07C 5/0808; G07C 5/085;
(Continued)

(56) References Cited

U.S. PATENT DOCUMENTS 5,210,704 A 5/1993 Husseiny
6,408,258 B1 6/2002 Richer
(Continued)

FOREIGN PATENT DOCUMENTS

EP 1923825 A2 5/2008
EP 1923825 A3 6/2008
(Continued)

OTHER PUBLICATIONS

Extended European Search Report for Application 20166427.3-1009, dated Oct. 6, 2020.
(Continued)

*Primary Examiner* — Mary Cheung
(74) *Attorney, Agent, or Firm* — Patterson + Sheridan, LLP

(57) ABSTRACT

The present disclosure provides for predictive part maintenance by generating a reliability curve for an aircraft based on historic removals; setting a removal threshold on the reliability curve; tracking an installation of a given instance of the aircraft part into a given aircraft; tracking a number of cycles of the given instance of the aircraft part based on operations of the given aircraft in which the given instance of the aircraft part is installed; and in response to the number of cycles of the given instance of the aircraft part satisfying the removal threshold, transmitting a service alert to an operator of the given aircraft.

25 Claims, 6 Drawing Sheets

(51) Int. Cl.
*G07C 5/00* (2006.01)
*G07C 5/08* (2006.01)

(58) Field of Classification Search
CPC . G05B 23/0251; G05B 23/0283; G06Q 10/20
See application file for complete search history.

(56) References Cited

U.S. PATENT DOCUMENTS

| | | |
|---|---|---|
| 6,490,543 B1 | 12/2002 | Jaw |
| 2008/0021604 A1* | 1/2008 | Bouvier ................ G06Q 10/06 701/29.5 |
| 2008/0154458 A1 | 6/2008 | Brandstetter et al. |
| 2008/0172268 A1 | 7/2008 | Wingenter |
| 2009/0083050 A1 | 3/2009 | Eltman et al. |
| 2009/0281735 A1 | 11/2009 | Bechhoefer |
| 2015/0051786 A1 | 2/2015 | Wang |
| 2015/0234951 A1 | 8/2015 | Andersson et al. |
| 2017/0073936 A1 | 3/2017 | Johnson et al. |
| 2018/0047224 A1 | 2/2018 | Clark, IV et al. |
| 2018/0335772 A1 | 11/2018 | Gorinevsky |
| 2018/0342116 A1 | 11/2018 | Wang |
| 2019/0080524 A1 | 3/2019 | Tucker |
| 2019/0146436 A1 | 5/2019 | Perez Zarate et al. |

FOREIGN PATENT DOCUMENTS

| | | |
|---|---|---|
| EP | 3258334 A1 | 12/2017 |
| EP | 3407269 A1 | 11/2018 |
| JP | 2002149868 A | 5/2002 |
| JP | 2003257808 A | 9/2003 |
| JP | 2018200681 A | 12/2018 |

OTHER PUBLICATIONS

Japanese Patent Office, Notice of Reasons for Rejection for Japanse Patent Application No. 2020-010770, dated Dec. 4, 2023.
Makoto Sato, Kenshi Mitsumoto and Eiji Kinoshita, Latest trends on advancement of maintenance; Analysis on elevator parts using data mining technology, Science of Management Operations-Research, vol. 57 No. 9, Juse Press, Ltd., Sep. 1, 2012, p. 512-517.

* cited by examiner

PREDICTIVE PART MAINTENANCE

CROSS-REFERENCE TO RELATED APPLICATION(S)

This application claims benefit of and priority to U.S. patent application Ser. No. 16/406,827, filed May 8, 2019. The aforementioned patent application is herein incorporated by reference in its entirety.

FIELD

The present disclosure generally relates to systems and methods for determining reliability of various parts of a vehicle, such as an aircraft.

BACKGROUND

Vehicles are used to transport individuals between locations. For example, commercial aircraft are used to transport passengers between various locations. A typical aircraft includes thousands, if not millions, of component parts. For example, each system, sub-system, structure, and the like of an aircraft may be formed from thousands of component parts.

As can be appreciated, aircraft operators and passengers value flights that are on time. Maintenance operations pose a potential delay for aircraft. For example, if it is determined that a particular part of an aircraft needs to be replaced between flights, a maintenance crew replaces the part. However, such maintenance procedures may cause the ensuing departure time to be delayed while the old part is replaced with a new part.

SUMMARY

The present disclosure provides a method in one aspect, the method including: generating a reliability curve for a vehicle part by: collecting usage data regarding a plurality of instances of the vehicle part, wherein for each respective instance of the vehicle part of the plurality of instances of the vehicle part: the usage data for the respective instance are collected at a time of removal from a vehicle associated with the respective instance, the usage data indicate a number of cycles accumulated by the respective instance of the vehicle part at the time of removal from the associated vehicle, and the usage data indicate whether the respective instance of the vehicle part is in a faulted state at the time of removal from the associated vehicle; determining a percentage of instances of the vehicle part that are in the faulted state at a plurality of numbers of cycles; and fitting a probability distribution function that defines the reliability curve to the usage data based on the percentage of instances of the vehicle part that are in the faulted state for each of the plurality of numbers of cycles; setting a removal threshold on the reliability curve; tracking an installation of a given instance of the vehicle part into a given vehicle; tracking a number of cycles of the given instance of the vehicle part based on operations of the given vehicle in which the given instance of the vehicle part is installed; and in response to the number of cycles of the given instance of the vehicle part satisfying the removal threshold, transmitting a service alert to an operator of the given vehicle.

In one aspect, in combination with any example method above or below, setting the removal threshold on the reliability curve further comprises: determining a number of historic removals of the vehicle part used to generate the reliability curve; and in response to the number of historic removals being below a predetermined setpoint, setting the removal threshold as a fixed number of cycles of the vehicle part.

In one aspect, in combination with any example method above or below, setting the removal threshold on the reliability curve further comprises: setting the removal threshold between a first point and a second point on the reliability curve, wherein the first point indicates a first number of cycles of the vehicle part at which at least a first percentage of operators historically removed the vehicle part from vehicle, wherein the second point indicates a second number of cycles of the vehicle part that was previously set for the removal threshold for the vehicle part, and setting a larger of the first point and the second point as the removal threshold.

In one aspect, in combination with any example method above or below, the method further comprises: setting an reorder threshold based on: a safety stock level, the removal threshold; a lead time for the vehicle part; a use rate of the given vehicle; and in response to the number of cycles of the given instance of the vehicle part satisfying the reorder threshold, transmitting an inventory alert to an operator of the given vehicle.

In one aspect, in combination with any example method above or below, the method further comprises: determining an intersection of the reliability curve and the removal threshold; comparing the intersection against an upper reliability threshold for the vehicle part; and in response to the number of cycles at the intersection being greater than the upper reliability threshold, transmitting a quality alert to an operator of the given vehicle.

In one aspect, in combination with any example method above or below, the method further comprises: determining an intersection of the reliability curve and the removal threshold; comparing the intersection against an a lower reliability threshold for the vehicle part; and in response to the number of cycles at the intersection being lower than the lower reliability threshold, transmitting a quality alert to an operator of the given vehicle.

In one aspect, in combination with any example method above or below, the method further comprises: in response to receiving additional samples of removals of the vehicle part, re-setting the removal threshold to a different value on the reliability curve.

In one aspect, in combination with any example method above or below, the given vehicle is an aircraft.

The present disclosure provides a method in one aspect, the method including: generating a reliability curve for a vehicle part by: collecting usage data regarding a plurality of instances of the vehicle part, wherein for each respective instance of the vehicle part of the plurality of instances of the vehicle part: the usage data for the respective instance are collected at a time of removal from a vehicle associated with the respective instance, the usage data indicate a number of flight hours accumulated by the respective instance of the vehicle part at the time of removal from the associated vehicle, and the usage data indicate whether the respective instance of the vehicle part is in a faulted state at the time of removal from the associated vehicle; determining a percentage of instances of the vehicle part that are in the faulted state at a plurality of numbers of flight hours; and fitting a probability distribution function that defines the reliability curve to the usage data based on the percentage of instances of the vehicle part that are in the faulted state for each of the plurality of numbers of flight hours; setting a removal threshold on the reliability curve; tracking an installation of a given instance of the vehicle part into a given vehicle;

tracking a number of flight hours of the given instance of the vehicle part based on operations of the given vehicle in which the given instance of the vehicle part is installed; and in response to the number of flight hours of the given instance of the vehicle part satisfying the removal threshold, transmitting a service alert to an operator of the given vehicle.

In one aspect, in combination with any example method above or below, setting the removal threshold further comprises: determining a number of historic removals of the vehicle part used to generate the reliability curve; and in response to the number of historic removals being below a predetermined setpoint, setting the removal threshold as a fixed value of flight hours for the vehicle part.

In one aspect, in combination with any example method above or below, setting the removal threshold further comprises: setting the removal threshold between a first point and a second point on the reliability curve, wherein the first point indicates a first number of flight hours accumulated by the vehicle part at which at least a first percentage of operators historically removed the vehicle part from vehicle, and wherein the second point indicates a second number of flight hours accumulated by the vehicle part that was previously set as the removal threshold for the vehicle part, and wherein a larger of the first point and the second point is set as the removal threshold.

In one aspect, in combination with any example method above or below, the method further comprises: setting an inventory threshold based on: a safety stock level; the removal threshold; a lead time for the vehicle part; and a use rate of the given vehicle; and in response to the number of flight hours accumulated by the given instance of the vehicle part satisfying the inventory threshold, transmitting an inventory alert to an operator of the given vehicle.

In one aspect, in combination with any example method above or below, the method further comprises: determining an intersection of the reliability curve and the removal threshold; comparing the intersection against an upper reliability threshold for the vehicle part; and in response to a number of cycles at the intersection being greater than the upper reliability threshold, transmitting a quality alert to an operator of the given vehicle.

In one aspect, in combination with any example method above or below, the method further comprises: determining an intersection of the reliability curve and the removal threshold; comparing the intersection against a lower reliability threshold for the vehicle part; and in response to a number of cycles at the intersection being lower than the lower reliability threshold, transmitting a quality alert to an operator of the given vehicle.

In one aspect, in combination with any example method above or below, the method further comprises: in response to receiving additional samples of removals of the vehicle part, re-setting the removal threshold to a different value on the reliability curve.

In one aspect, in combination with any example method above or below, the given vehicle is an aircraft.

The present disclosure provides a system in one aspect, the system including: a processor; and a memory storage device, including instructions that when performed by the processor enable the processor to perform an operation comprising: generating a reliability curve for a vehicle part; setting a removal threshold on the reliability curve; tracking an installation of a given instance of the vehicle part into a given vehicle; tracking operations of the given instance of the vehicle part based on operations of the given vehicle in which the given instance of the vehicle part is installed; and in response to the operations of the given instance of the vehicle part satisfying the removal threshold, transmitting a service alert to an operator of the given vehicle.

In one aspect, in combination with any example system above or below, setting the removal threshold further comprises: determining a number of historic removals of the vehicle part used to generate the reliability curve; and in response to the number of historic removals being below a predetermined setpoint, setting the removal threshold as a fixed value of operations of the vehicle.

In one aspect, in combination with any example system above or below setting the removal threshold further comprises: determining a number of historic removals of the vehicle part used to generate the reliability curve; and in response to the number of historic removals exceeding a predetermined setpoint: setting the removal threshold between a first point and a second point on the reliability curve, wherein the first point indicates a first number of operations of the vehicle part at which at least a first percentage of operators historically removed the vehicle part from vehicle, and wherein the second point indicates a second number of operations of the vehicle part at which at least a second percentage of operators historically removed the vehicle part from the vehicle that is greater than the first percentage.

In one aspect, in combination with any example system above or below, generating the reliability curve for the vehicle part further comprises: collecting usage data from several instances of the vehicle part at a time of removal from an associated vehicle that indicate a number of cycles accumulated by a particular instance of the vehicle part at the time of removal from the associated vehicle and whether the particular instance of the vehicle part is in a faulted state at the time of removal; determining percentages the vehicle part in a faulted state at per number of cycles; and fitting a probability distribution function to the usage data based on the percentages of the vehicle part in the faulted state.

In one aspect, in combination with any example system above or below, generating the reliability curve for the vehicle part further comprises: collecting usage data from several instances of the vehicle part at a time of removal from an associated vehicle that indicate a number of flight hours accumulated by a particular instance of the vehicle part at the time of removal from the associated vehicle and whether the particular instance of the vehicle part is in a faulted state at the time of removal; determining percentages the vehicle part in a faulted state per hours of flight; and fitting a probability distribution function to the usage data based on the percentages of the vehicle part in the faulted state.

In one aspect, in combination with any example system above or below, the operations of the vehicle part are tracked based on a number of cycles of the vehicle part while the vehicle part is installed, further comprising: setting an inventory threshold based on: the removal threshold; a lead time for the vehicle part; a use rate of the given vehicle; and a cycles per flight coefficient for the vehicle part; and in response to the operations of the given instance of the vehicle part satisfying the inventory threshold, transmitting an inventory alert to an operator of the given vehicle.

In one aspect, in combination with any example system above or below, the operations of the vehicle part are tracked based on a number of flight hours of the vehicle while the vehicle part is installed, further comprising: setting an inventory threshold based on:
the removal threshold; a lead time for the vehicle part; and a use rate of the given vehicle; and in response to the operations of the given instance of the vehicle part satisfying the inventory threshold, transmitting an inventory alert to an operator of the given vehicle.

In one aspect, in combination with any example system above or below, the operation further comprises: determining an intersection of the reliability curve and the removal threshold; comparing the intersection against an upper reliability threshold and a lower reliability threshold for the vehicle part; and in response to a number of operations of the vehicle part at the intersection being one of greater than of the upper reliability threshold or less than the lower reliability threshold, transmitting a quality alert to an operator of the given vehicle.

In one aspect, in combination with any example system above or below, the given vehicle is an aircraft.

BRIEF DESCRIPTION OF THE DRAWINGS

So that the manner in which the above recited features can be understood in detail, a more particular description, briefly summarized above, may be had by reference to example aspects, some of which are illustrated in the appended drawings.

DETAILED DESCRIPTION

Figure 1:
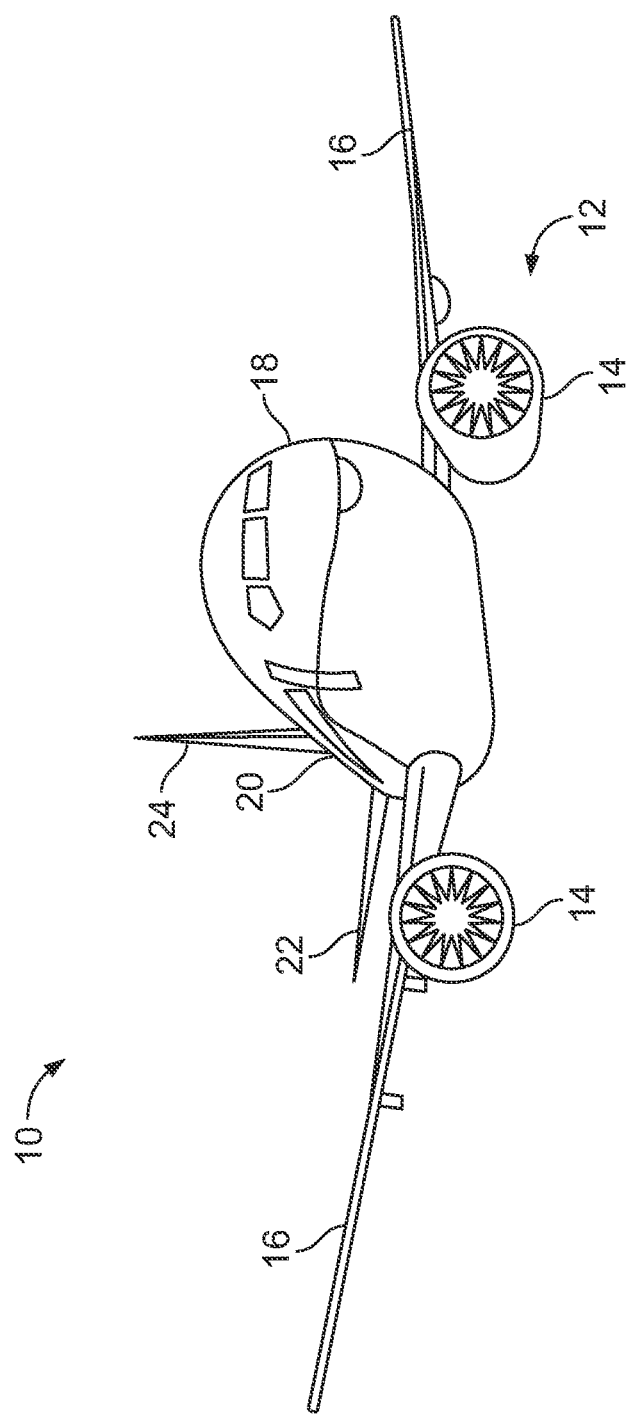
FIG. 1 is a diagrammatic representation of a front perspective view of a vehicle, according to aspects of the present disclosure.

Aircraft operators routinely perform maintenance at scheduled intervals. Often, maintenance is scheduled such that aircraft are taken out of service at times that minimally disrupt scheduled flights, and at locations where parts and technicians are available, while also extending the time between scheduled maintenance operations for as long as possible. Some parts of an aircraft are associated with sensors that constantly or periodically monitor one or more characteristics of those parts, but other parts (and some aspects of the monitored parts) are monitored by technicians when the aircraft is on the ground. To speed up turn around for inspections or repair, and maximize the availability of an aircraft for flight operations, some parts of an aircraft may be replaced before a fault occurs in the part, and some parts may be removed from the aircraft (and replaced with another part) to allow the part to be inspected independently of the aircraft. Parts that are removed and replaced for inspection may be installed in another aircraft or later reinstalled in the original aircraft once the inspection (or a repair) is complete. Accordingly, as an aircraft is used and maintenance is performed, the use-status of the various parts of that aircraft will vary.

Various parts of an aircraft are designed to be consumed during operations (e.g., landing gear tires) and replaced at particular intervals, which are referred to herein as consumable parts. In contrast, other parts are designed to be repaired if a non-conformance develops (e.g., a landing gear strut), and are referred to herein as non-consumable or durable parts. Durable parts that can be removed and replaced with another part for inspections or repair independently of the rest of the aircraft and are placed back into service independently of an individual aircraft's operations are referred to herein as routable parts.

The present disclosure provides systems and methods for generating alerts, regarding when an individual component approaches a service lifetime threshold, and could be repaired or replaced. Such alerts may be used by a wide variety aircraft operators, including airports, airlines, manufacturers, contracted maintenance entities, and agents thereof. Although the examples given herein are presented primarily using aircraft, the present disclosure is equally applicable for operators of other types of vehicles, such as, for example, trucks, cars, buses, spacecraft, watercraft, and trains. Accordingly, any reference made to an aircraft may be understood to also apply to another type of vehicle, and any reference to time in flight, flight, or aircraft specific parts (e.g., a tail) may be understood to refer to time-in-travel, travel, or a part of a different type of vehicle (e.g., a caboose, a stern, a rear bumper).

Generally, the time or cycles or days of operation of individual parts may be tracked in relation with the aircraft in which the parts are installed. A service alert may be generated in anticipation of the part reaching a service lifetime threshold. An inventory alert may be generated in conjunction with the service alert based on an expected use rate so that new parts can be ordered and delivered (and technicians and flight plans scheduled) to a particular location in time to replace that part before the part is fully consumed or develops a nonconformance.

Aspects of the present disclosure may be understood in two stages. A first stage collects data for various parts installed on several aircraft. The collected data indicate when an individual part was installed on a particular aircraft, when (if) the part is removed from the aircraft, and whether the part is in a faulted or non-faulted state when removed. These data, in conjunction with operational data for the aircraft on which the parts are installed, are used to determine lifetime reliability curves for each type part that is tracked in aggregate. A second stage uses the lifetime curves to develop alert thresholds, and transmits alerts to responsible parties when the operations of an aircraft affect an individual part.

Various aspects of the present disclosure provide systems and methods that are configured to determine life expectancy of various parts of a vehicle, such as an aircraft. Knowledge of vehicle part life has various advantages, including an ability to provide improved vehicle design, efficient support of vehicle operation, the ability to predict component removal times, the ability to determine a number of spare parts to have on hand, and support of maintenance checks.

Certain aspects of the present disclosure provide systems and methods of determining reliability of components of a vehicle, such as an aircraft. The systems and methods determine part life distribution. After the part life distribution is determined, the systems and methods are able to determine reliability and remaining life of the various parts of the vehicle. For example, the systems and methods are able to determine how long a part will last, an average life of a part, when a part may be susceptible to faults, risk associated with an existing part remaining on a vehicle, and a number of spare parts an aircraft operator needs for a predetermined time period.

Reliability in relation to a part relates to the probability that the part will perform the intended function of that part for a stated period of time. Some of the systems and methods described herein assess the reliability of one or more parts of a vehicle in order to predict when the part(s) should be replaced before a potential fault.

In at least one aspect, a part reliability determination system collects and stores flight hours and flight cycles during which parts have been in service. The flight hours and flight cycles are stored as usage data within a vehicle usage database. The part reliability determination system may, for each part, store a time since the part was installed (TSI) or since the part was last overhauled (TSO) or since it was first time to use (TSN), and the number of cycles (in which a cycle is measured as a departure to arrival of a vehicle) since the part was installed (CSI) or since the part was last overhauled (CSO) or since it was first put to use (CSN). However, TSI/CSI, TSO/CSO and TSN/CSN may not be directly available in part removal data. For example, operators may not be required to provide TSI/CSI when a part is removed from an aircraft or due to time constraints, or operators may not have time to collect the data. Accordingly, various aspects of the present disclosure provide a part reliability determination system that is configured to determine TSI/CSI, TSO/CSO, and TSN/CSN for removed parts.

In at least one aspect, the part reliability determination system is also configured to determine TSI and CSI for parts that are currently on a vehicle, such as an aircraft. In order to determine the TSI and CSI data, the part reliability determination system retrieves vehicle configuration data and vehicle readiness log data, which may be stored in a vehicle usage database. By analyzing the vehicle configuration data and vehicle readiness log data and component removals, the part reliability determination system determines how many of parts with the same part numbers have been removed and how many of them are still on the vehicle. By determining part removals, the part reliability determination system determines when a part was installed and how long the component has been on the vehicle.

Aspects of the present disclosure provide systems and methods that integrate data sources and estimate TSI/CSI from both removed parts and parts that are still on aircrafts. The systems and methods are configured to predict when parts of a vehicle are susceptible to fault based on aircraft part life distribution. By predicting when a part is susceptible to fault, the systems and methods allow for the part to be replaced before such predicted time.

FIG. 1 is a diagrammatic representation of a front perspective view of a vehicle, in this example an aircraft 10, according to an exemplary aspect of the present disclosure. The aircraft 10 includes a propulsion system 12 that may include two turbofan engines 14, for example. Optionally, the propulsion system 12 may include more engines 14 than shown. The engines 14 are carried by wings 16 of the aircraft 10. In other aspects, the engines 14 may be carried by a fuselage 18 and/or an empennage 20. The empennage 20 may also support horizontal stabilizers 22 and a vertical stabilizer 24.

The fuselage 18 of the aircraft 10 defines an interior cabin, which may include a cockpit, one or more work sections (for example, galleys, personnel carry-on baggage areas, and the like), one or more passenger sections (for example, first class, business class, and economy sections), and an aft section. Each of the sections may be separated by a cabin transition area, which may include one or more class divider assemblies. Overhead stowage bin assemblies may be positioned throughout the interior cabin.

The aircraft 10 includes numerous systems and subsystems that include numerous parts. For example, the propulsion system 12 includes thousands of component parts. As another example, each lavatory onboard the aircraft 10 includes thousands of component parts. The entire aircraft 10 includes millions of separate and distinct parts that together form the aircraft 10. A part reliability determination system is used to determine a life distribution for each of the parts, and predict a remaining life (for example, time until the part may be susceptible to fault) for the parts of the aircraft 10. In at least one aspect, the part reliability determination system determines the remaining life in relation to flight hours and/or flight cycles of the aircraft 10.

Alternatively, instead of an aircraft, aspects of the present disclosure may be used with various other vehicles, such as automobiles, buses, locomotives and train cars, watercraft, spacecraft, and the like.

Figure 2:
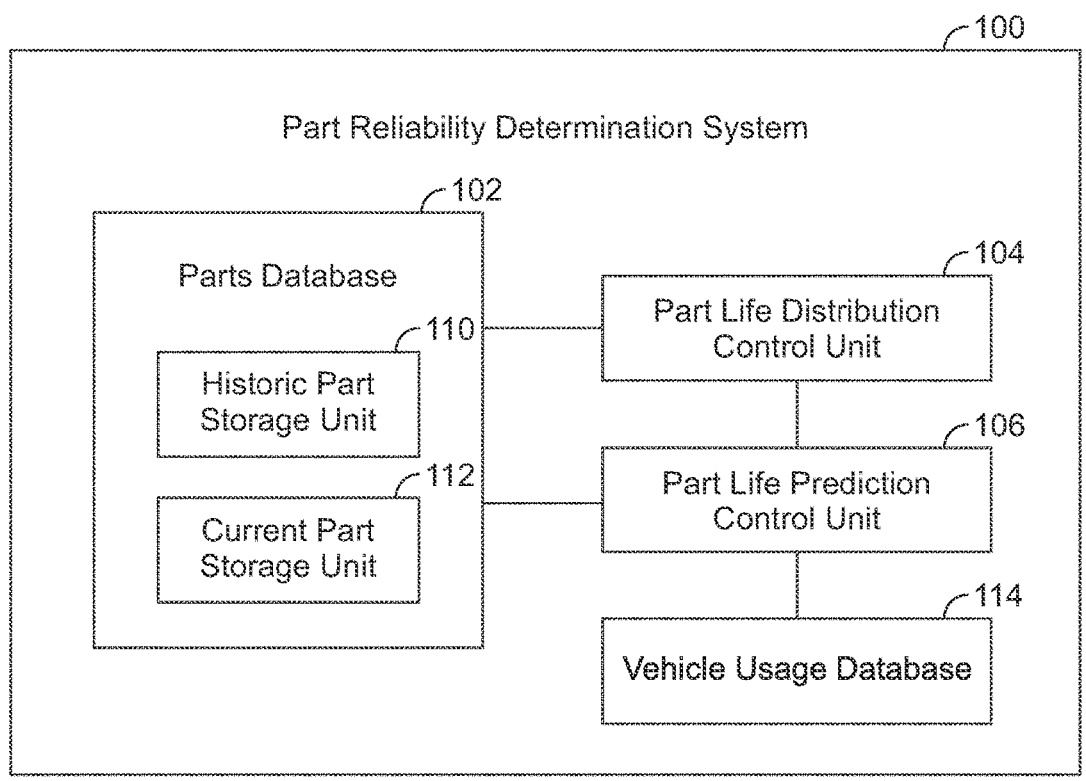
FIG. 2 is a schematic representation of a part reliability determination system, according to aspects of the present disclosure.

FIG. 2 is a schematic representation of a part reliability determination system 100, according to an exemplary aspect of the present disclosure. The part reliability determination system 100 includes a parts database 102 that is in communication with a part life distribution control unit 104, and a part life prediction control unit 106, such as through one or more wired or wireless connections. The part life distribution control unit 104 and the part life prediction control unit 106 are also in communication with one another, such as through one or more wired or wireless connections.

The part reliability determination system 100 may be onboard the aircraft 10 (shown in FIG. 1) or remotely located from the aircraft 10, such as at a land-based monitoring station. In at least one aspect, one or both of the part life distribution control unit 104 or the part life prediction control unit 106 may be onboard the aircraft 10, while the parts database 102 is remotely located therefrom, such as at a land-based monitoring station. In at least one aspect, the parts life distribution control unit 104 and the part life prediction control unit 106 may be in communication with the parts database 102 through various communication networks, such as, but not limited to, the Internet.

As shown, the part life distribution control unit 104 and the part life prediction control unit 106 may be separate and distinct control units. Optionally, the part life distribution control unit 104 and the part life prediction control unit 106 may be components of a single control unit or processing system.

In at least one aspect, the parts database 102 includes a historic part storage unit 110, and a current part storage unit 112. The historic part storage unit 110 stores data for all type of parts of the aircraft compiled over time for numerous aircraft. For example, the historic part storage unit 110 may store data regarding the useful life of all parts currently on an aircraft but aggregated for past uses with respect to the aircraft and various other aircraft (for example, other same-molded aircraft). The data may include life data (that is, the time of actual usage) for each of the parts. In at least one aspect, the historic part storage unit 110 stores all available data for the parts currently on the aircraft, but which have been used with respect to the current aircraft and all other aircraft for which such data is available.

As an example, a particular aircraft includes a particular part. The historic part storage unit 110 stores available data collected from the use of different parts of the same type of the installed particular part. These data include the aggregated lifetimes and fault statuses for the parts of the particular type, which have been previously used with respect to several aircraft (potentially including the particular aircraft). As such, the historic part storage unit 110 may store data for a particular type of part used in connection with hundreds, thousands, or more aircraft.

The current part storage unit 112 stores current life data for all parts currently on the aircraft. For example, the current part storage unit 112 stores data regarding time since each part was installed (TSI), cycles since each part was installed (CSI), and the like. In this manner, the current part storage unit 112 stores current life data regarding the actual usage (that is, life) of each part.

In at least one aspect, the part reliability determination system 100 also includes a vehicle usage database 114 that stores vehicle usage data indicative of the actual usage of a vehicle having the parts. The vehicle usage database 114 is in communication with the part life prediction control unit 106, such as through one or more wired or wireless connections. As an example, the vehicle usage database 114 stores vehicle usage data for an aircraft, such as in terms of flight hours (that is, actual hours of in-flight operation) and flight cycles (that is, total number of cycles, in which a cycle is defined as a departure and associated arrival).

The part life prediction control unit 106 is configured to determine a remaining life of a part of a vehicle based on a part life distribution of the particular type of part. As such, the part life prediction control unit 106 is configured to determine the remaining life of the part based on current life data regarding the part (such as stored in the current part storage unit 112) and the part life distribution related to the part, as determined by the part life distribution control unit 104. In at least one aspect, the part life prediction control unit 106 determines the remaining life of a part as a function of the determined part life distribution of the particular type of part and the actual usage of the vehicle. For example, the part life prediction control unit 106 may determine a remaining life of a current part of an aircraft in terms of flight hours and/or flight cycles of an aircraft.

In operation, the part life distribution control unit 104 analyzes the historic part data for each part stored in the historic part storage unit 110. The part life distribution control unit 104 determines a life distribution for a particular part based on the historic part data, which, as noted, may be compiled with respect to uses in relation to several aircraft in a fleet of aircraft (owned or operated by one entity or distributed across several entities). In at least one aspect, the part life distribution control unit 104 determines a life distribution for a particular type of part based on analysis of the historic part data. In at least one aspect, the part life distribution control unit 104 may determine the life distribution based on one or more mathematical models and formulas.

As but one example, the part life distribution control unit 104 may determine an average life of a particular type of part based on historical data regarding hundreds, thousands, or millions of actual lives (that is, times of actual use of a particular part) of the particular type of part. For example, the part life distribution control unit 104 may be based on hundreds, thousands, or even millions of actual life usages of prior parts. As such, the part life distribution control unit 104 determines a part life distribution for a particular type of part. In at least one aspect, the part life distribution control unit 104 determines a part life distribution for each particular type of part of an aircraft. In at least one other aspect, the part life distribution control unit 104 determines a part life distribution for less than each particular type of part of an aircraft.

After determining a part life distribution for a particular type of part of an aircraft, the part life prediction control unit 106 analyzes the current part data of the aircraft, which is stored in the current part storage unit 112. The part life prediction control unit 106 assesses the various current parts (that is, the parts that currently form one or more portions) of the aircraft, as stored in the current part data. For example, the current part data stores the TSI, CSI, and/or the like for the current parts. The TSI and CSI for each part may be provided and stored in the current part storage unit 112. In at least one other aspect, the TSI and CSI may not be provided. Instead, the part life prediction control unit 106 may determine the TSI and CSI based on dates of prior part removals, statistical analysis of installation and removal dates of parts, and/or the like. The part life prediction control unit 106 analyzes the part life distribution for each type of part (as determined by the part life distribution control unit 104) in relation to each current part of the aircraft to predict a remaining life of the current parts.

In at least one aspect, the part life prediction control unit 106 determines a current life of a part based on vehicle usage data stored in the vehicle usage database 114. For example, the part life prediction control unit 106 correlates the TSI and/or CSI of a part and cross-references such current life data with vehicle usage data stored in the vehicle usage database 114. Based on the TSI and/or CSI and the actual vehicle usage (in terms of hours and/or cycles), the part life prediction control unit 106 determines a current life of a part in terms of vehicle hours of usage and/or cycles. The part life prediction control unit 106 may then compare the current life of the part in relation to the part life distribution for that particular type of part to predict a remaining life of the part, such as in terms of remaining hours and/or cycles.

As an example, a vacuum generator for a lavatory onboard the aircraft is one type of part. The part life distribution control unit 104 analyzes the historic data for vacuum generators that is stored in the historic part storage unit 110. Based on the historic data for vacuum generators, the part life distribution control unit 104 determines a part life distribution for vacuum generators. For example, the part life distribution control unit 104 may determine an average useful life for a vacuum generator based on the historic data for vacuum generators stored in the historic part storage unit 110. The part life prediction control unit 106 then analyzes the current part storage unit 112 and confirms that a vacuum generator is onboard the aircraft. The current part storage unit 112 stores current data for the vacuum generator. The current data includes the TSI, for example, for the vacuum generator onboard the aircraft. The part life prediction control unit 106 then correlates the part life distribution for vacuum generators (as determined by the part life distribution control unit 104) with the current life data for the vacuum generator onboard the aircraft. Based on the correlation between the part life distribution for vacuum generators and the current data for the actual vacuum generator onboard the aircraft, the part life prediction control unit 106 predicts a remaining useful life for the actual vacuum generator. As an example, the part life prediction control unit 106 subtracts the time of use of the actual vacuum generator (for example, flight hours elapsed from TSI until current date) from the part life distribution for vacuum generators. In this manner, the part life prediction control unit 106 predicts when the actual vacuum generator may be susceptible to fault. In various aspects, the part life prediction control unit 106 outputs a prediction signal or alert to a flight operation, maintenance crew, automated inventory/maintenance scheduler, or the like, when the TSI or CSI crosses a predetermined threshold for ongoing reliability.

As another example, a pump for a bilge onboard a ship is one type of part. The part life distribution control unit 104 analyzes the historic data for bilge pumps that is stored in the historic part storage unit 110. Based on the historic data for bilge pumps, the part life distribution control unit 104 determines a part life distribution for bilge pumps. For example, the part life distribution control unit 104 may determine an average useful life for a bilge pump based on the historic data for bilge pumps stored in the historic part storage unit 110. The part life prediction control unit 106 then analyzes the current part storage unit 112 and confirms that a bilge pump is onboard the ship. The current part storage unit 112 stores current data for the bilge pump. The current data includes the TSI, for example, for the bilge pump onboard the ship. The part life prediction control unit 106 then correlates the part life distribution for bilge pumps (as determined by the part life distribution control unit 104) with the current life data for the bilge pump onboard the ship. Based on the correlation between the part life distribution for bilge pumps and the current data for the actual bilge pump onboard the ship, the part life prediction control unit 106 predicts a remaining useful life for the actual bilge pump. As an example, the part life prediction control unit 106 subtracts the time of use of the actual bilge pump (for example, hours at sea elapsed from TSI until current date) from the part life distribution for bilge pumps. In this manner, the part life prediction control unit 106 predicts when the actual bilge pump may be susceptible to fault. In various aspects, the part life prediction control unit 106 outputs a prediction signal or alert to a voyage operation, maintenance crew, automated inventory/maintenance scheduler, or the like, when the TSI or CSI crosses a predetermined threshold for ongoing reliability.

The part reliability determination system 100 operates in such a manner for at least one part of the aircraft. In at least one aspect, the part reliability determination system 100 determines a part life distribution and predicts a remaining useful life for each and every part of the aircraft (or any subset thereof).

As used herein, the term "control unit," "central processing unit," "unit," "CPU," "computer," or the like may include any processor-based or microprocessor-based system including systems using microcontrollers, reduced instruction set computers (RISC), application specific integrated circuits (ASICs), logic circuits, and any other circuit or processor including hardware, software, or a combination thereof capable of executing the functions described herein. Such are exemplary only, and are thus not intended to limit in any way the definition and/or meaning of such terms. For example, the part life distribution control unit 104 and the part life prediction control unit 106 may be or include one or more processors that are configured to control operation of the part reliability determination system 100, as described herein. The part life distribution control unit 104 and the part life prediction control unit 106 may be separate and distinct control units, or may be part of the same control unit.

The part life distribution control unit 104 and the part life prediction control unit 106 are configured to execute a set of instructions that are stored in one or more data storage units or elements (such as one or more memories), in order to process data. For example, the part life distribution control unit 104 and the part life prediction control unit 106 may include or be coupled to one or more memories. The data storage units may also store data or other information as desired or needed. The data storage units may be in the form of an information source or a physical memory element within a processing machine.

The set of instructions may include various commands that instruct the part life distribution control unit 104 and the part life prediction control unit 106 as processing machines to perform specific operations such as the methods and processes of the various aspects of the subject matter described herein. The set of instructions may be in the form of a software program. The software may be in various forms such as system software or application software. Further, the software may be in the form of a collection of separate programs, a program subset within a larger program or a portion of a program. The software may also include modular programming in the form of object-oriented programming. The processing of input data by the processing machine may be in response to user commands, or in response to results of previous processing, or in response to a request made by another processing machine.

The diagrams of aspects herein may illustrate one or more control or processing units, such as the part life distribution control unit 104 and the part life prediction control unit 106. It is to be understood that the processing or control units may represent circuits, circuitry, or portions thereof that may be implemented as hardware with associated instructions (e.g., software stored on a tangible and non-transitory computer readable storage medium, such as a computer hard drive, ROM, RAM, or the like) that perform the operations described herein. The hardware may include state machine circuitry hardwired to perform the functions described herein. Optionally, the hardware may include electronic circuits that include and/or are connected to one or more logic-based devices, such as microprocessors, processors, controllers, or the like. Optionally, the part life distribution control unit 104 and the part life prediction control unit 106 may represent processing circuitry such as one or more of a field programmable gate array (FPGA), application specific integrated circuit (ASIC), microprocessor(s), and/or the like. The circuits in various aspects may be configured to execute one or more algorithms to perform functions described herein. The one or more algorithms may include aspects of aspects disclosed herein, whether or not expressly identified in a flowchart or a method.

As used herein, the terms "software" and "firmware" are interchangeable, and include any computer program stored in a data storage unit (for example, one or more memories) for execution by a computer, including RAM memory, ROM memory, EPROM memory, EEPROM memory, and non-volatile RAM (NVRAM) memory. The above data storage unit types are exemplary only, and are thus not limiting as to the types of memory usable for storage of a computer program.

Figure 3:
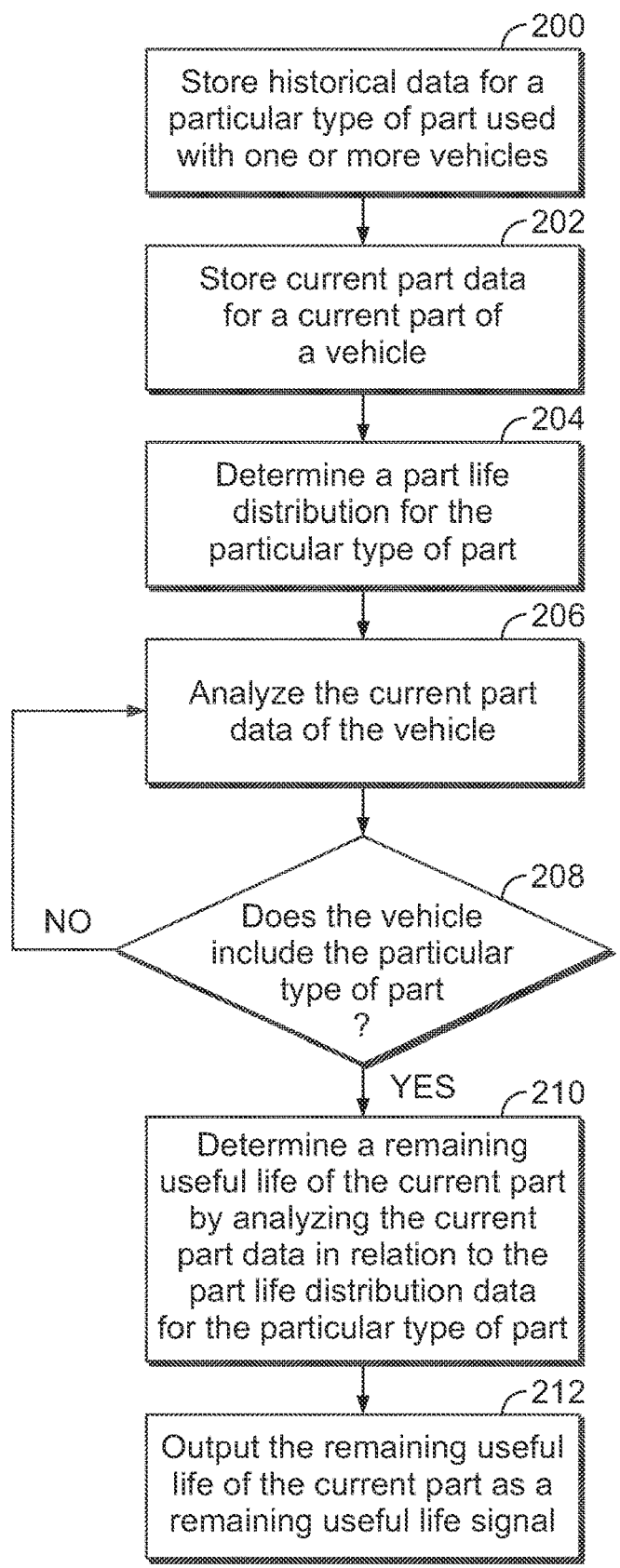
FIG. 3 is a flowchart of a method of determining part reliability, according to aspects of the present disclosure.

FIG. 3 is a flowchart of a method of determining part reliability, according to an exemplary aspect of the present disclosure. Referring to FIGS. 2 and 3, at 200, historical data for a particular type of part used with one or more vehicles is stored, such as in the historic part storage unit 110 of the parts database 102. At 202, current part data for a current (that is, currently forming a portion) of a vehicle is stored, such as in the current part storage unit 112 of the parts database 102.

A 204, a part life distribution for the particular type of part is determined, such as by the part life distribution control unit 104. At 206, the current part data of the vehicle is analyzed, such as by the part life prediction control unit 106. At 208, it is determined whether the vehicle includes the particular type of part. If the vehicle does not include the particular type of part, the method returns to 206 (or alternatively, ends). If, however, the vehicle does include the particular type of part at 208, the method proceeds to 210, at which a remaining useful life of the current part is determined by the part life prediction control unit 106. For example, the part life prediction control unit 106 analyzes the current part data (which is indicative of a current lifetime of the current part) in relation to the part life distribution data for the particular type of part to predict a remaining useful life of the current part.

At 212, the part life prediction control unit 106 outputs the remaining useful life of the current part as a remaining useful life signal. The remaining useful life signal may include one or more of a graphical, video, text, and/or audio signal that communicates the remaining useful life of the current part to an individual.

In at least one aspect, the remaining useful life signal may be communicated based on predetermined thresholds. For example, the part life prediction control unit 106 may only output the remaining useful life signal when the remaining useful life of the current part is within a predetermined amount of time and/or a predetermined number of cycles (such as a percentage thereof) until being susceptible to fault. In this manner, the part life prediction control unit 106 is able to proactively alert individuals (such as aircraft operators, maintenance personnel, and the like) to required replacements. The method shown in FIG. 3 may be performed for each and every part of a vehicle (or any subset thereof). The predetermined threshold is chosen on the reliability curve 300 (or the CDF curve 302), as discussed in greater detail in regard to FIG. 4.

Referring again to FIG. 2, in order to determine a current lifetime of a part, the part life prediction control unit 106 may first determine TSI and/or CSI for the part. The installation date for a particular part, as well as a removal data for an immediately preceding part that was replaced by the particular part are stored in the current part storage unit 112. However, data regarding a particular installation or removal may not be readily available. As described below, the part reliability determination system 100 may be configured to determine installation and removal dates, even when such information is not initially reported or otherwise provided by an aircraft operator, manufacturer, or the like. After TSI and CSI data is determined, the part life prediction control unit 106 may use one or more mathematical models (for example, a Weibull model, an exponential model, a gamma model, or a log normal model) to predict a remaining life of a part.

The parts life prediction control unit 106 integrates part removals that are known (such as reported and stored in the historic part storage unit 110), aircraft configuration data (such as indicating the various parts of the aircraft), part interchangeability data, and aircraft usage data (for example, flight hours and/or flight cycles), which may be stored in memory and/or at a central monitoring station.

In at least one aspect, in order to determine remaining part life, the part life prediction control unit 106 retrieves data regarding when part tracking first occurred. Such data may be stored in the historic part storage unit 110 and/or the current part storage unit 112.

In at least one aspect, the part life prediction control unit 106 builds a chain that links installations and removals of a particular type of part. In doing so, the part life prediction control unit 106 determines an overall usage of the part. For example, if the particular type of part was removed and installed five times over a particular time period, the part life prediction control unit 106 is able to determine an average useful life of the part via the number of faulted removals over the particular time period.

In some situations, the part life prediction control unit 106 may not be able to access reported dates of removal and installation. As such, the part life prediction control unit 106 may be unable to construct a chain that links installations and removals.

In at least one aspect, when the quantity of the part per aircraft (QPA) equals 1 (that is, there is only one of such part on the aircraft), part usage may be determined from the date of last removal. For example, based on the date the particular part was last removed, the part life prediction control unit 106 may determine a remaining useful life of the current part (which replaced the removed part) based on the previous removal date, as well as the part life distribution of the part, as determined by the part life distribution control unit 104.

If the quantity of part per aircraft (QPA) for the particular type of part is greater than 1 (that is, there are more than one of such part on the aircraft), and there are no observed removals (for example, no stored dates of removal in the parts database 102), the part life prediction control unit 106 may determine each last removal of a part number with QPA>1 and may determine the usage from one last removal to the end of a study for each part with the same part number. For example, the part life prediction control unit 106 may determine the last three known removals of a particular type of part. The part life prediction control unit 106 may also determine usage of the parts from the time or cycle of the most recent removal to an end of a relevant study period.

In at least one aspect, the part life prediction control unit 106 determines a number (n) of removals and QPA (m>1) of a part number. In such an m>n case, the part life prediction control unit 106 determines the usage of parts for m-n parts. In at least one aspect, the part life prediction control unit 106 determines which parts are flight hours associated and which parts are flight cycles associated, and uses flight hours to estimate part life if flight hours related, and flight cycles to estimate part life if flight cycles associated.

The current part data stored in the current part storage unit 112 may include one or both of TSI and CSI for a current part, as reported by a manufacturer or aircraft operator, for example. That is, a known first date and/or known first cycle of use of the part may be input into the current part storage unit 112.

The part life distribution control unit 104 and/or the part life prediction control unit 106 detects vehicle configuration and quantity (for example, QPA) for a part from vehicle engineering configuration data, aircraft readiness log data, IPC (illustrated part catalog), and/or the like, which may be stored in the current part storage unit 112 and/or the vehicle usage database 114.

For a situation in which there is only one type of particular part onboard the aircraft (such as an aircraft including a single vacuum generator), such that the QPA=1, the part life prediction control unit 106 is able to determine when the part is removed. In at least one aspect, the part life prediction control unit 106 detects a removal sequence of parts with the same part number on an aircraft.

The part life prediction control unit 106 may determine a TSI or a CSI for a part based, at least in part, on the part number or serial number of the part. In at least one aspect, the part life prediction control unit 106 is configured to detect when the part number began to be tracked. For example, the date of first tracking of the part may be a portion of the current part data stored in the current part storage unit 112. Further, the part life prediction control unit 106 analyzes the flight hours/cycles of the aircraft, such as stored in the vehicle usage database 114. Accordingly, the part life prediction control unit 106 may then detect the flight hours/cycles at the time when a part was removed from the aircraft. The part life prediction control unit then calculates TSI and/or CSI for the removed part. The part life prediction control unit 106 then identifies when a part that replaced (that is, the replacement part) the removed part is installed on the aircraft. The part life prediction control unit 106 then monitors the flight times and cycles for the replacement part.

In at least one aspect, the part life prediction control unit 106 detects all other parts of the aircraft with QPA=1 that have not been reported as removed, but which there have been reported removal of the same part number from a different aircraft. The part life distribution control unit 104 and/or the part life prediction control unit 106 may then detect how many other aircraft have the same part number.

In at least one aspect, the part reliability determination system 100 (such as through one or both of the part life distribution control unit 104 and/or the part life prediction control unit 106) detects when removals for the part number initially started being reported. The flight hours/cycles of each aircraft are then determined for the times when part removals first started being reported.

If QPA for a part onboard an aircraft exceeds 1, the part life prediction control unit 106 constructs a chain of removed and installed parts, such as in conjunction with their serial numbers. The part life prediction control unit 106 may identify a part in the chain. Next, it is determined when the part was installed on the aircraft and when the part was removed from the aircraft. Such information may be stored in the historic part storage unit 110. Next, the flight hours/cycles when the part was installed and the flight hours/cycles when the part was removed are stored in the historic part storage unit 110. Then, the part life prediction control unit 106 calculates one or both of TSI and/or CSI of the part. The part life prediction control unit 106 identifies the installation date and the removal date for a removed part, both of which may be stored in the historic part storage unit 110 and/or the current part storage unit 112. Again, the part life prediction control unit 106 may then identify the flight hours and/or cycles of the aircraft at the time when the part was installed and flight hours and/or cycles of the aircraft at the time when the part was removed.

In at least one aspect, the part reliability determination system 100 is configured to identify removed parts with blank serial numbers and/or removed parts without installed part information. The part life distribution control unit 104 and/or the part life prediction control unit 106 first identifies all removed parts with the same part number. Then, the first removal(s) of parts with the same part number are identified. Next, dates when removals were first reported for the part number are identified. Next, the later of the aircraft delivery date (that is, when first delivered to an aircraft operator) and/or the date when removals were first reported is then identified. Then, the flight hours/cycles of the aircraft at the date that is later are identified. For example, the aircraft may have been delivered on Date 1, while removal of particular parts was reported on Date 2, which is after Date 1. Thus, the date when removals were first reported (that is, Date 2) is later than the date when the aircraft was delivered (that is, Date 1). The flight hours/cycles of the aircraft are then identified from Date 2. After the flight hours/cycles of the aircraft at the date that is later are identified, a part removal data is identified.

The part reliability determination system 100 may also identify the last removal(s) with the same part numbers. The date(s) of removal(s) is correlated with the flight hours and/or cycles of the aircraft. The TSI and/or CSI is then calculated for the parts that are still on the aircraft.

The system 100 may also identify all removals with the same part number and count the number (m) of removals for the parts. The system 100 identifies QPA (n) for the parts. The system 100 then detects parts with m>n. The system 100 then determines the later of the delivery date of the aircraft and the date when removals started being reported. The system 100 then calculates TSI and/or CSI for the part (in which m>n).

In at least one aspect, the part life prediction control unit 106 calculates mean and standard deviation of TSI and mean and standard deviation of CSI for each part number. The part life prediction control unit 106 compares a normalized standard deviation of TSI and CSI separately, and determines if the part is associated with flight hours or flight cycles.

As indicated, the part life prediction control unit 106 may use one or more mathematical models to determine a remaining life of a part. For example, the part life prediction control unit 106 may determine a remaining life of a part through use of a Weibull model, as shown below:

$$pdf = f(t) = \begin{cases} \frac{\beta}{\alpha}\left(\frac{t}{\alpha}\right)(\beta-1)e^{-\frac{t^\beta}{\alpha}} & t \geq 0 \\ 0 & t < 0 \end{cases}$$

where pdf is a probability distribution function, $\alpha$ is a scale parameter that may be defined by one or both of a TSI or CSI for the part, and $\beta$ is a shape parameter that may be defined by one of both of the TSI or CSI for the part. When $\beta=1$, the Weibull model becomes an exponential model. Although the models and formulas presented herein are given in relation to time t for a TSI example, it will be appreciated that a CSI example may use the same formulas with the substitution of cycles c for time t.

A time dependent fault rate, h, is given by $$h = \frac{\beta}{\alpha}\left(\frac{t}{\alpha}\right)^{(\beta-1)}.$$

A cumulative distribution function (CDF), F(t), is given by $$F(t) = 1 - e^{-\left(\frac{t}{\alpha}\right)^\beta}$$
$$t \geq 0.$$

A Reliability function, R(t), is given by $$R(t) = e^{-\left(\frac{t}{\alpha}\right)^\beta}.$$

$\alpha$ is a scale parameter. $\beta$ is a shape parameter. When $\beta=1$, the Weibull model is the exponential model.

Figure 4:
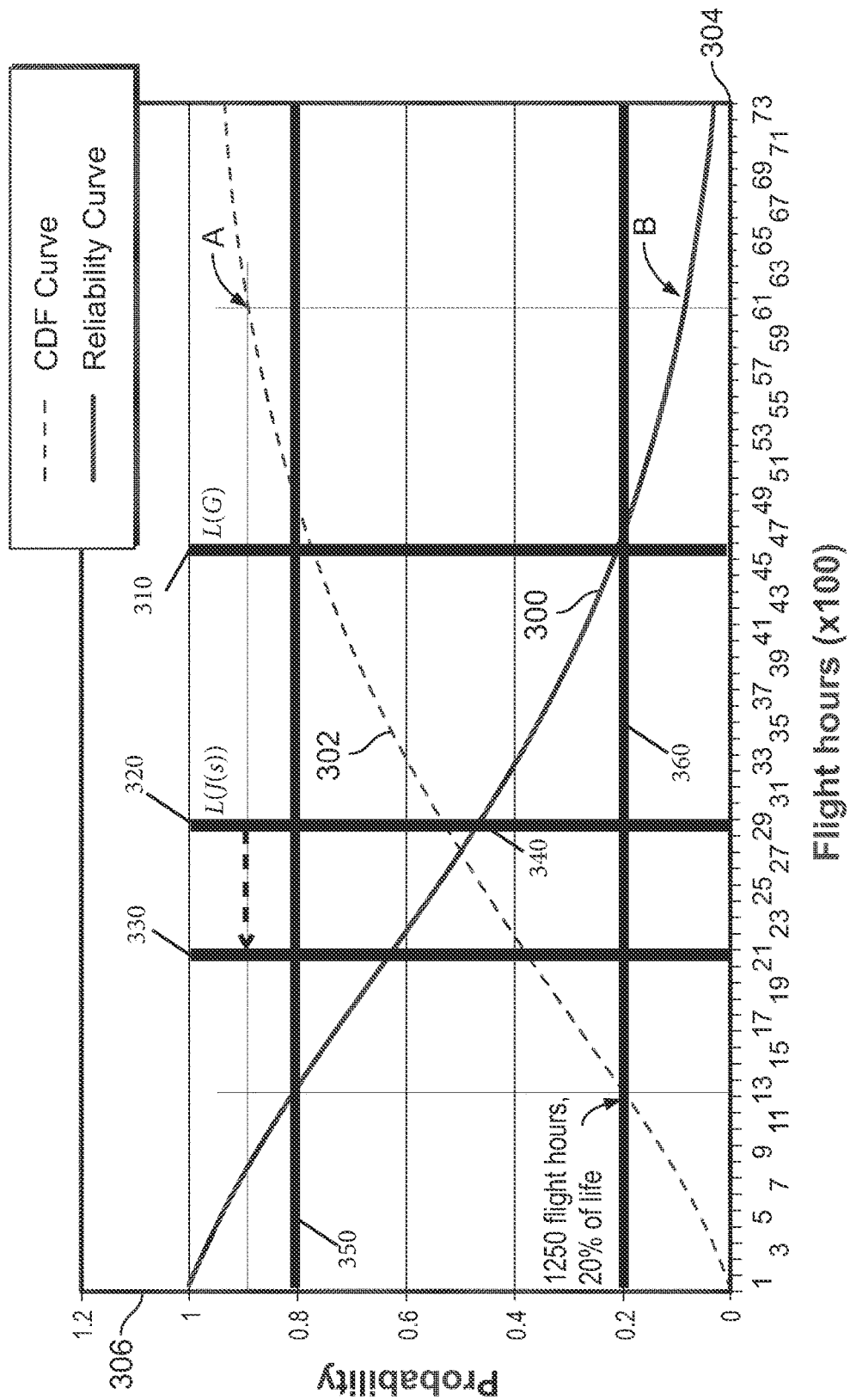
FIG. 4 is a diagrammatic representation of a graph of a reliability curve and a Cumulative Distribution Function curve with various thresholds defined thereon, according to aspects of the present disclosure.

FIG. 4 is a diagrammatic representation of a graph of a reliability curve 300 and a CDF curve 302, according to an exemplary aspect of the present disclosure. The part life prediction control unit 106 determines the curves 300 and 302 via a mathematical model, such as the Weibull model. As shown, the curves are plotted in relation to flight hours 304 and reliability probability 306, although in other aspects, the curves may be plotted in relation to cycles and reliability probability 306. As shown in FIG. 4, the part life prediction control unit 106 determines that a particular part has served 90% of life at 6150 flight hours at point A, based on the CDF curve 302. Similarly, the part life prediction control unit 106 determines that the particular part has a 10% reliability probability at point B. Based on one or both of the curves 300 and 302, an operator may decide to replace the part at a particular time, depending on a predetermined probability that the part will continue to be reliable.

As another example, the part life prediction control unit 106 may determine a remaining life of a part through use of the exponential model, as shown below:

$$pdf\ f(t) = \begin{cases} \lambda * e^{-\lambda t} & t \geq 0 \\ 0 & t < 0 \end{cases}$$

in which the fault rate, $h=\lambda$ is a constant fault rate.
Cumulative Distribution Function (CDF):

$$F(t) = \begin{cases} 1 - e^{-\lambda t} & t \geq 0 \\ 0 & t < 0 \end{cases}$$

Further, a survival function/reliability function, R(t), is given as $R(t)=e^{-\lambda t}$ As another example, the part life prediction control unit 106 may determine a remaining life of a part through use of a gamma model, as shown below.

$$pdf{:}f(t) = \frac{\beta^\alpha t^{\alpha-1} e^{-t\beta}}{\Gamma(\alpha)}$$

$$\text{Fault Rate:} \frac{f(t)}{R(t)}$$

$$CDF{:}F(T) = \int_0^T f(t)\, dt$$

Reliability, $R(t)$ is given as $R(t) = 1 - F(t)$

As another example, the part life prediction control unit 106 may determine a remaining life of a part through use of a log normal model, as shown below.

$$pdf{:}f(t) = \frac{1}{\sigma t\sqrt{2\pi}} e^{-\frac{1}{2\sigma^2}(\ln(t)-\ln(T_{50}))^2},\ \text{where}\ T_{50} = e^\mu$$

$$\text{Fault Rate:} \frac{f(t)}{R(t)}$$

$$CDF{:}F(T) = \int_0^T \frac{1}{\sigma t\sqrt{2\pi}} e^{-\frac{1}{2\sigma^2}(\ln(t)-\ln(T_{50}))^2}\, dt$$

Reliability: $R(t) = 1 - F(t)$

The part life prediction control unit 106 may determine remaining life of a part through one or more of the mathematic models shown above. Optionally, the part life prediction control unit 106 may determine remaining life of a part through various other mathematical models, formulas, and the like that fit a probability distribution function to the usage data based on the percentages of the part in the faulted state. For example, the part life prediction control unit 106 may determine remaining life through an average, mean, statistical parameter(s), or the like of a particular type of part, as determined through data compiled for thousands, if not millions, of like parts.

As described herein, aspects of the present disclosure provide part reliability determination systems and methods that may integrate data sources and estimate TSI and/or CSI, TSO and/or CSO, TSN and/or CSN from both removed parts and parts that are still on aircraft. Certain parts of an aircraft may be associated exclusively with one of flight hours or flight cycles. For example, landing gear parts are typically associated with cycles instead of hours. As such, part life distributions and predictions for parts associated with cycles are determined in relation to cycles, and not flight hours. Conversely, part life distributions and predictions for parts associated with flight hours are determined in relation to hours, and not flight cycles. Some parts may be associated with both flight hours and flight cycles, and will be associated with two part life distributions: one based on flight hours and one based on flight cycles. Alerts for parts using two life distribution curves may be generated for each curve, the earlier point on the two curves, the later point on the two curves, or an average point from the two curves. For example, a hose component may have a service lifetime of "20,000 flight hours or 5,000 cycles; whichever comes first".

The data used to determine the reliability curves 300 and CDF curves 302 for the various parts of the aircraft are collected from across several aircraft. For example, all aircraft that include a given type of part may provide usage data (e.g., time in flight, number of flights) and fault/replacement data on those parts that are aggregated to develop the models that produce the curves. As more data are collected, the models and resulting curves can be made more accurate in determining the expected lifetime of a given part.

However, some parts may have less data available than other parts. For example, a newly designed part (e.g., an update or upgrade to an existing part) may not have any data available related to removals or faults for several months or years until the first removal occurs. As removals occur (e.g., due to preventative maintenance or in response to faults) more data are gathered for the real-world fault rate for that part, and the model for that part becomes more accurate in fitting the removal and faulted states to a probability distribution function. However, in some aspects, operators may desired alerts to schedule the removal of parts for which historical data are not yet available. In other aspects, operators may desire to life-test a part with an unknown expected life curve (or a removal setpoint believed to be too early in the life cycle of the part) so that a given instance of the part remains installed until a fault occurs (thus generating fault status data for the part that indicate when a faulted state occurred).

A target removal threshold 310, an active removal threshold, and a forecasted replacement threshold 330 are illustrated on the CDF curve 302 and the reliability curve 300.

The removal thresholds indicate the number of flight hours or cycles since installation at which a given percent of a type of part has historically been removed from the aircraft of a fleet, and may be determined via a lookup function L(x), where x is a percentage, and L(x) returns the number of hours or cycles at which x % of the parts have been historically removed from an aircraft—either due to planned or unplanned maintenance events.

The target removal threshold 310 defines a point in operations for a type of aircraft part (e.g., a number of cycles or accumulated flight hours) at which G % of a type of part have historically been removed from aircraft—either due to planned or unplanned maintenance events. The value G used to determine the target removal threshold 310 is a constant (e.g., 95%, 80%), but the resulting target removal threshold 310 may vary in the number of flight hours since installation (TSI) or cycles since installation (CSI) as additional data are collected on the removal of parts. For example, during a first year, 95% of a given type of part may be removed from aircrafts after 2,000 hours of service, while during a third year, 95% of that same part may be removed from aircrafts after 3,000 hours of service, as operators become more familiar with the durability of the part. Individual operators may select different values to use for G for individual parts. For example, a first operator may select G=95 for vacuum generators and G=90 for light fixtures, while a second operator may select G=85 for vacuum generators and for light fixtures.

The survival threshold 320 defines a point in operations for a part at which J % of the given type of part have historically survived past. A part may be removed early in a lifetime due to issues during shakedown, improper installation, an overabundance of caution from maintenance personnel, a lack of training in maintenance personnel, etc. For example, during a first year, 20% of a given type of part may be removed from aircrafts after more than 200 hours of service, while during a third year, 95% of that same part may be removed from aircrafts after 300 hours of service, as operators become more familiar with the durability of the part. Individual operators may select different values to use for J for individual parts. For example, a first operator may select J=20 for vacuum generators and J=10 for light fixtures, while a second operator may select J=25 for vacuum generators and for light fixtures.

An operator selects to use the associated value for the number of flight hours of cycles from G % or J % based on which value corresponds to the greater number of hours or cycles. For example, comparing the results of the lookup function L(G) and L(J), the operator selects the greater value. As data are collected over time, the lookup function will return different values, and whether L(G) or L(J) is used as a the active threshold to determine when to generate a service alert may change accordingly.

In some aspects, when the size of the data set against which the lookup function L(x) is run is below a predefined number of samples, the value of L(x) may be replaced by a preset value of hours or cycles until a predetermined number of samples have been collected, and transition to the lookup function L(G∥J) as more samples are collected. In one example, until fifty (50) removals have been observed, the active removal threshold may be set to 20,000 cycles (e.g., based on a manufacturer warranty, a threshold for prior version of the part, a testing regime, etc.), and after fifty removals have been observed, the active removal threshold may use the number of hours/cycles indicated according to the target removal threshold 310 or the survival threshold 320.

$$\text{Active removal threshold} = \begin{cases} \text{preset amount } s \leq \text{setpoint} \\ L(G \| J) \, s > \text{setpoint} \end{cases}$$

In some aspects, the part life prediction control unit 106 compares the intersection 340 of the survival threshold 320 and the reliability curve 300 against an upper reliability threshold 350 and a lower reliability threshold 360 for the part, and generates a quality alert when the number of hours or cycles at the intersection 340 falls outside of the reliability thresholds. The quality alert may be transmitted to an aircraft operator, maintenance personnel, engineering team, supplier, or the like to redesign the part or reset procedures for when a part is removed. For example, when the intersection 340 correlates to a portion of the reliability curve 300 where the part is indicated to have a reliability probability above the upper reliability threshold 350 (e.g., 80% reliable versus an upper reliability threshold 350 of 50%), the part life prediction control unit 106 may generate an under-use alert to indicate that maintenance personnel are removing the part too frequently or too early. In another example, when the intersection 340 correlates to a portion of the reliability curve 300 where the part is indicated to have a reliability probability below the lower reliability threshold 360 (e.g., 20% reliable versus a lower reliability threshold 360 of 30%), the part life prediction control unit 106 may generate an over-use alert to indicate that maintenance personnel are not removing the part early enough or frequently enough to avoid unplanned maintenance.

The part life prediction control unit 106 generates a service alert in response to the number of cycles or hours of flight (e.g., CSI/TSI) exceeding the active removal threshold (i.e., the selected target removal threshold 310 or the survival threshold 320). However, to replace the part removed from the aircraft, a replacement part is needed. Accordingly, the part life prediction control unit 106 determines a forecasted replacement threshold 330 (that correlates to a reorder threshold 430, discussed in relation to FIG. 5 to determine when to place an order for a part to be ready for installation when the operator removes a given part (e.g., in response to the service alert)). An inventory order may be placed to a supplier to manufacture the part, a warehouse to deliver an existing part to a new location, etc. The forecasted replacement threshold 330 represents an expected amount of cycles or flight hours in advance of the removal threshold an operator would need to place an order for additional parts if the parts to be removed are not held in inventory.

To determine the forecasted replacement threshold 330, the part life prediction control unit 106 looks up the lead time $T_{Lead}$ of the part (i.e., the expected time from placing an order for a part to receiving the part at a specified destination) from the parts database 102 and converts the lead time to operational time based on data from the vehicle usage database 114 for the aircraft on which the part is to be installed. For example, the vehicle usage database 114 may include an expected use rate for a given aircraft of $z_{TSI}$ flight hours per time period (e.g., z hours in flight per day/week/month/etc.) or $z_{CSI}$ flights per time period (e.g., z flights per day/week/month/etc.), which is converted to a number of cycles based on a historic cycles per flight coefficient q for the part (e.g., q cycles of that part per flight; q=1 when one flight corresponds to one cycle).

The part life prediction control unit 106 identifies the hours/cycles specified by the active removal threshold and calculates where to place the forecasted replacement threshold 330 based on the expected use rate and the lead time, as indicated below.

$$IL_{lead} = \begin{cases} \text{Current inventory level} - \sum_{k=1}^{N} I_{P_i} TSI \\ \text{Current inventory level} - \sum_{k=1}^{M} I_{P_i} CSI \end{cases}$$

IF $IL_{lead}$<=Safety Stock, THEN Reorder Threshold=current inventory level
ELSE No Reorder alert Where N and M are the number of parts, which are associated with either flight hours or flight cycles, available to the operator, and $$I_{P_i} = \begin{cases} 0, & \text{if the hours of the part do not reach the threshold during } T_{Lead} \\ 1, & \text{if the hours of the part reach the threshold during } T_{Lead} \end{cases}$$

or $$I_{P_i} = \begin{cases} 0, & \text{if the cycles of the part do not reach the threshold during } T_{Lead} \\ 1, & \text{if the cycles of the part reach the threshold during } T_{Lead} \end{cases}$$

For example, for a part replaced based on TSI having a removal threshold corresponding to 20,000 flight hours, a lead time $T_{Lead}$ of 90 days, and an expected use rate $z_{TSI}$ of 100 hours per week, the part life prediction control unit 106 sets the forecasted replacement threshold 330 to 19,825 flight hours (when rounded down to the nearest multiple of 25 hours). In another example, for another part on the same aircraft as the above example that is replaced based on CSI having a removal threshold corresponding to 2,000 cycles, a lead time $T_{Lead}$ of 100 days, an expected use rate $z_{CSI}$ of 20 flights per week, and 2 cycles per flight, the part life prediction control unit 106 sets the forecasted replacement threshold 330 to 1,420 cycles (when rounded down to the nearest multiple of 10 cycles).

Figure 5:
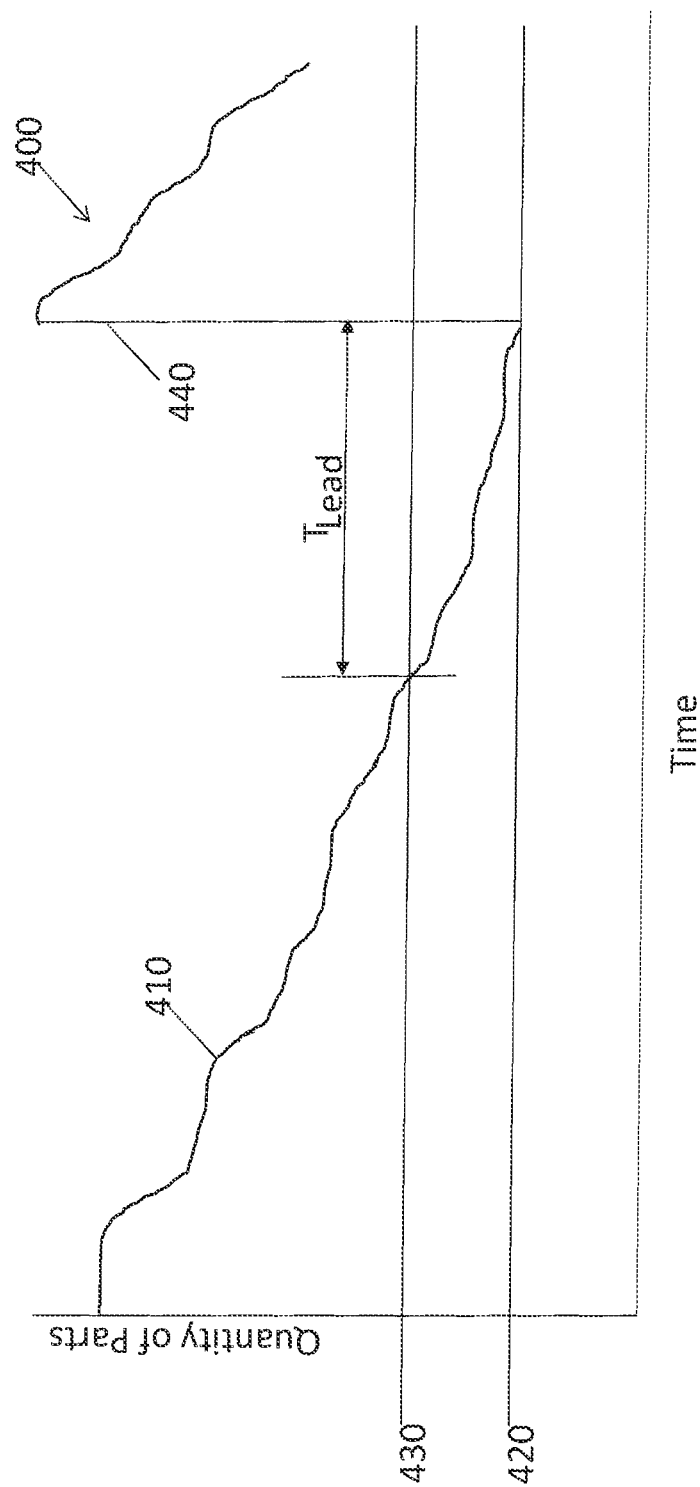
FIG. 5 is a diagrammatic representation of an inventory level, according to aspects of the present disclosure.

FIG. 5 illustrates an inventory curve 400 that tracks the number of individual parts (held by an operator or at a specific location by an operator) over time. In some aspects, the inventory level 410 decreases over time as parts are taken from inventory and placed into aircraft or other assemblies, and may increase (e.g., by a reorder quantity 440) when inventory is delivered or re-shelved (e.g., as in rotatable parts cleared for further use). By determining the lead time, $T_{Lead}$, as described herein, an operator may place an order to a supplied or upstream holding facility an expected amount of time before a safety stock level 420 is reached. When multiple values for $T_{Lead}$ exist, for example, when several curves are developed for a part in different use cases, the operator may use an average value for $T_{Lead}$ or a smallest value for $T_{Lead}$. In various aspects, the safety stock level 420 may be zero or any quantity greater than zero.

The inventory level 410 defines a reorder threshold 430 at a time $T_{Lead}$ in advance of the time when the safety stock level 420 is expected to be reached based on operational data received from users (e.g., of aircraft). For example, when a consumption rate is one part per day, the safety stock level 420 is fifty parts, and $T_{Lead}$ is five days, the reorder threshold 430 is fifty-five parts. When the inventory level 410 reaches a reorder threshold 430, the part life prediction control unit 106 generates and transmits an inventory alert to the parts database 102. The parts database 102, in turn, determines whether to place an order for the part to a supplier based on a number of that part (or an equivalent substitute part) currently held in inventory, minimum order sizes for the part, minimum and maximum inventory carrying levels for that part, whether an alternative version of that part is available (e.g., a directive to use version 1.0 of part A or version 2.0 of part A interchangeably), whether a substitute part is available, etc.

Figure 6:
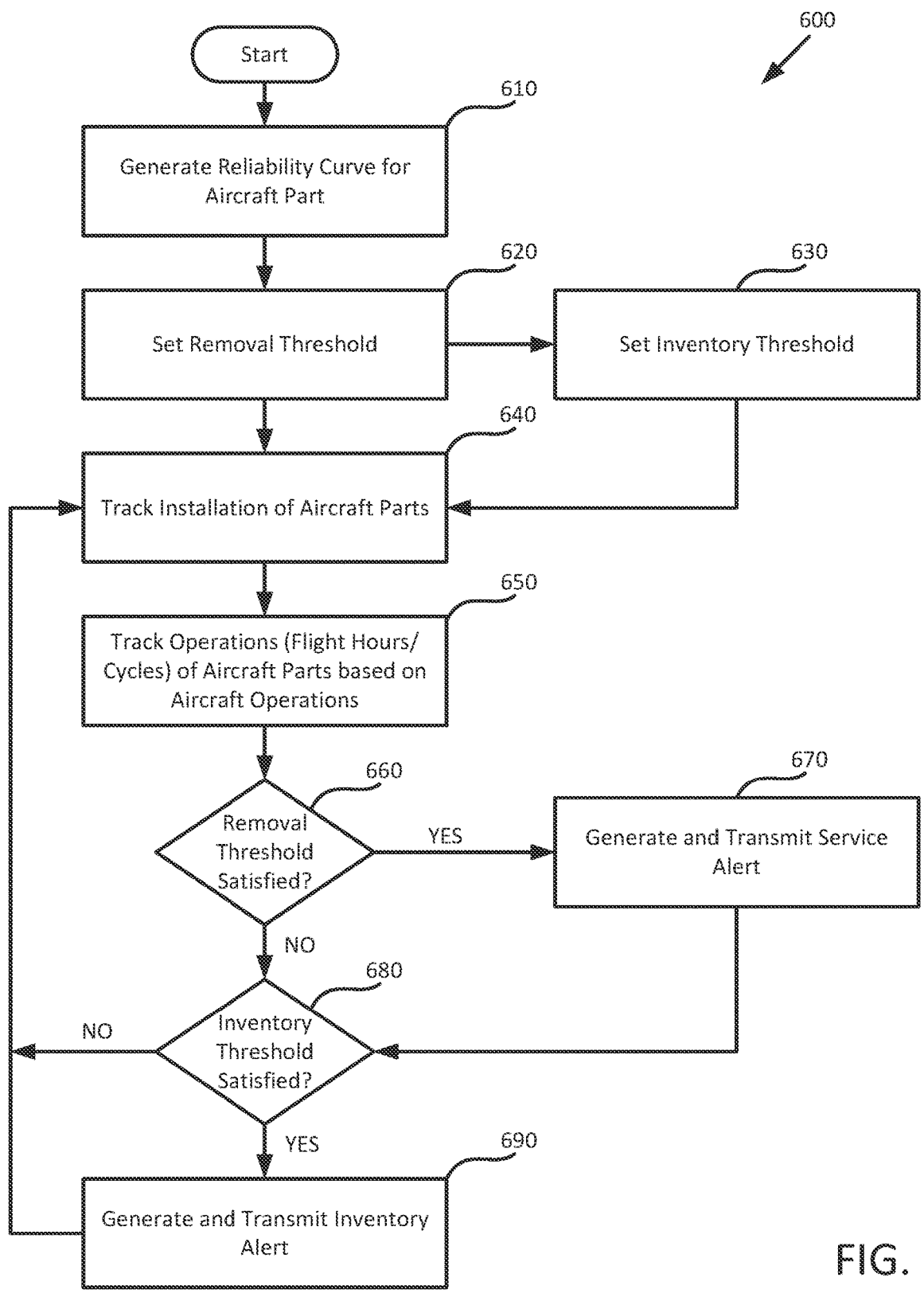
FIG. 6 is a flowchart of a method for generating service and/or inventory alerts for aircraft parts based on aircraft operations, according to aspects of the present disclosure.

FIG. 6 is a flowchart of a method 600 for generating service and inventory alerts for aircraft parts based on aircraft operations.

Method 600 begins with block 610, where a part reliability determination system 100 generates a reliability curve 300 for an aircraft part (e.g., according to method 200 discussed in relation to FIG. 3). When generating the reliability curve 300, the part reliability determination system collects usage data from some or all instances of the aircraft part from an associated aircraft. The part reliability determination system also collects usage data from several instances of the aircraft part while these instances are still installed on aircraft. The usage data indicate whether the given instance of the part is in a faulted state at the time of removal and one or more of a number of cycles accumulated by a given instance of the aircraft part or a number of flight hours accumulated by a given instance of the aircraft part at the time of removal from the associated aircraft 10. Based on the usage data for the removed part, the part reliability determination system 100 determines what percentage of the aircraft parts are in a faulted state at several points of the reliability curve 300 (e.g., at a given numbers of cycles or at a given number of flight hours), and fits a probability distribution function to the usage data indicating what the percentages the aircraft part in the faulted state at a plurality of numbers of cycles or flight hours over the lifetime of the aircraft part. In various aspects, the aircraft parts that are removed in a non-faulted state may be re-installed to the original aircraft or a different aircraft to accumulate additional cycles and/or flight hours.

At block 620, the part reliability determination system 100 sets the active removal threshold for the aircraft part on the reliability curve 300. In one example, the part reliability determination system 100 sets the active removal threshold based on the number of historic removals of the part used to generate the reliability curve 300 per block 610. When the number of historic removals is below a predetermined amount, the part reliability determination system 100 sets the active removal threshold based on a preset value of number of cycles or flight hours (e.g., based on a manufacturer's recommendation). When the number of flight hours or cycles of historic removals exceeds a predetermined amount, the part reliability determination system 100 sets the active removal threshold to one of the target removal threshold 310 or the survival threshold 320; whichever is associated with the greater number of flight hours or cycles. In various aspects, as more samples of removals of the aircraft part are received from operators, the value of the active removal threshold for the aircraft part on the reliability curve 300 may be reset based on the new and/or expanded removal data.

At block 630, the part reliability determination system 100 (optionally) sets the reorder threshold 430 for the aircraft part based on the removal threshold. The reorder threshold 430 is determined to be at an earlier point in the lifecycle of the aircraft part to account for lead times (e.g., $T_{Lead}$) and the expected use rate of the aircraft and the part in the aircraft. In aspects where a part type is tracked based on CSI, the part reliability determination system 100 sets the reorder threshold 430 based on the removal threshold, a lead time for the aircraft part, a use rate of the aircraft 10, and a cycles-per-flight coefficient for the aircraft part. In aspects where a part type is tracked based on TSI, the part reliability determination system 100 sets the reorder threshold 430 based on the removal threshold, a lead time for the aircraft part, and a use rate of the aircraft. In various aspects, the reorder threshold 430 is set based on Just In Time (JIT) order levels so that the inventory level 410 is equal to the safety stock level 420 when the ordered aircraft parts arrive.

At block 640, the part reliability determination system 100 tracks installation data for when installations of the aircraft part into an aircraft occurred. In various aspects, the installation of a given part into a given aircraft is tracked according to a serial number or other identifier of the individual part associated with the given aircraft so that at block 650, the part reliability determination system 100 can track operations of the aircraft part based on operations of the aircraft in which the aircraft part is installed. For example, when the aircraft is tracked as being in flight for 2,000 hours since the time of installation of a given part, the part reliability determination system 100 associates the installed part as having accumulated 2,000 flight hours. In aspects using rotatable parts (i.e., parts that may be installed, uninstalled, and then reinstalled on the same or a different aircraft), the part reliability determination system may add the time or cycles accumulated by a part in a current installation to the time or cycles accumulated in prior installations.

At block 660, the part reliability determination system 100 determines whether the installation data and the operations of the aircraft indicate that a part installed thereon has satisfied the removal threshold set at block 620. In response to determining that the operations of the aircraft part satisfy the removal threshold, method 600 proceeds to block 670. Otherwise, method 600 proceeds to block 680.

At block 670, the part reliability determination system 100 generates a service alert. The part reliability determination system 100 may transmit the service alert to aircraft operators, maintenance personnel, and the like to schedule maintenance for the aircraft. The service alert may be transmitted over wired or wireless means as an electronic message including text, a part identifier, an aircraft identifier, a date at which the service alert is generated, and other information related to servicing the aircraft to replace the aircraft part for which the service alert is generated. In various aspects, the service alert is generated by the aircraft on which the aircraft part is currently installed in response to flight operations of that aircraft (e.g., on landing, the service alert is generated if the removal threshold is satisfied). In other aspects, an operator system (e.g., a flight scheduling system) generates the service alert when a given aircraft is scheduled to satisfy the removal threshold or has reported operations that satisfy the removal threshold.

At block 680, the part reliability determination system 100 determines whether the installation data and the operations of the aircraft indicate that a part installed thereon has satisfied the reorder threshold 430. In response to determining that the operations of the aircraft part satisfy the reorder threshold 430, method 600 proceeds to block 690. Otherwise, method 600 returns to block 640 to continue tracking the installation of parts and the operations of the aircraft and parts installed therein.

At block 690, the part reliability determination system 100 generates an inventory alert. The part reliability determination system 100 may transmit the inventory alert to a parts database 102, a supplier order system, a maintenance team, or the like. The inventory alert may be transmitted over wired or wireless means as an electronic message including text, a part identifier, an aircraft identifier, a date at which the inventory alert is generated, a date at which an associated service alert is expected to be generated (based on currently projected aircraft use rates), and other information related to ordering a part for servicing the aircraft to replace the aircraft part for which the inventory alert is generated. In various aspects, the inventory alert is generated by the aircraft on which the aircraft part is currently installed in response to flight operations of that aircraft (e.g., on landing, the inventory alert is generated if the inventory threshold is satisfied). In other aspects, an operator system (e.g., a flight scheduling system) generates the inventory alert when a given aircraft is scheduled to satisfy the inventory threshold or has reported operations that satisfy the inventory threshold. Method 600 then returns to block 640 to continue tracking the installation of parts and the operations of the aircraft and parts installed therein.

In the current disclosure, reference is made to various aspects. However, it should be understood that the present disclosure is not limited to specific described aspects. Instead, any combination of the following features and elements, whether related to different aspects or not, is contemplated to implement and practice the teachings provided herein. Additionally, when elements of the aspects are described in the form of "at least one of A and B," it will be understood that aspects including element A exclusively, including element B exclusively, and including element A and B are each contemplated. Furthermore, although some aspects may achieve advantages over other possible solutions and/or over the prior art, whether or not a particular advantage is achieved by a given aspect is not limiting of the present disclosure. Thus, the aspects, features, aspects and advantages disclosed herein are merely illustrative and are not considered elements or limitations of the appended claims except where explicitly recited in a claim(s). Likewise, reference to "the invention" shall not be construed as a generalization of any inventive subject matter disclosed herein and shall not be considered to be an element or limitation of the appended claims except where explicitly recited in a claim(s).

As will be appreciated by one skilled in the art, aspects described herein may be embodied as a system, method or computer program product. Accordingly, aspects may take the form of an entirely hardware aspect, an entirely software aspect (including firmware, resident software, micro-code, etc.) or an aspect combining software and hardware aspects that may all generally be referred to herein as a "circuit," "module" or "system." Furthermore, aspects described herein may take the form of a computer program product embodied in one or more computer readable medium(s) having computer readable program code embodied thereon.

Program code embodied on a computer readable medium may be transmitted using any appropriate medium, including but not limited to wireless, wireline, optical fiber cable, RF, etc., or any suitable combination of the foregoing.

Computer program code for carrying out operations for aspects of the present disclosure may be written in any combination of one or more programming languages, including an object oriented programming language such as Java, Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of the present disclosure are described herein with reference to flowchart illustrations and/or block diagrams of methods, apparatuses (systems), and computer program products according to aspects of the present disclosure. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the block(s) of the flowchart illustrations and/or block diagrams.

These computer program instructions may also be stored in a computer readable medium that can direct a computer, other programmable data processing apparatus, or other device to function in a particular manner, such that the instructions stored in the computer readable medium produce an article of manufacture including instructions which implement the function/act specified in the block(s) of the flowchart illustrations and/or block diagrams.

The computer program instructions may also be loaded onto a computer, other programmable data processing apparatus, or other device to cause a series of operational steps to be performed on the computer, other programmable apparatus or other device to produce a computer implemented process such that the instructions which execute on the computer, other programmable data processing apparatus, or other device provide processes for implementing the functions/acts specified in the block(s) of the flowchart illustrations and/or block diagrams.

The flowchart illustrations and block diagrams in the Figures illustrate the architecture, functionality, and operation of possible implementations of systems, methods, and computer program products according to various aspects of the present disclosure. In this regard, each block in the flowchart illustrations or block diagrams may represent a module, segment, or portion of code, which comprises one or more executable instructions for implementing the specified logical function(s). It should also be noted that, in some alternative implementations, the functions noted in the block may occur out of the order noted in the Figures. For example, two blocks shown in succession may, in fact, be executed substantially concurrently, or the blocks may sometimes be executed in the reverse order or out of order, depending upon the functionality involved. It will also be noted that each block of the block diagrams and/or flowchart illustrations, and combinations of blocks in the block diagrams and/or flowchart illustrations, can be implemented by special purpose hardware-based systems that perform the specified functions or acts, or combinations of special purpose hardware and computer instructions.

While the foregoing is directed to aspects of the present disclosure, other and further aspects of the disclosure may be devised without departing from the basic scope thereof, and the scope thereof is determined by the claims that follow.

What is claimed is:

1. A method, comprising:
   generating a reliability curve for a vehicle part by:
      collecting usage data regarding a plurality of instances of the vehicle part, wherein for each respective instance of the vehicle part of the plurality of instances of the vehicle part:
         the usage data for the respective instance are collected at a time of removal from a vehicle associated with the respective instance,
         the usage data indicate a number of cycles accumulated by the respective instance of the vehicle part at the time of removal from the associated vehicle, and
         the usage data indicate whether the respective instance of the vehicle part is in a faulted state at the time of removal from the associated vehicle;
      determining a percentage of instances of the vehicle part that are in the faulted state at a plurality of numbers of cycles; and
      fitting a probability distribution function that defines the reliability curve to the usage data based on the percentage of instances of the vehicle part that are in the faulted state for each of the plurality of numbers of cycles;
   setting a removal threshold on the reliability curve based on a number of cycles for historical removals of the vehicle part and a forecasted number of cycles for removal of the vehicle part;
   tracking an installation of a given instance of the vehicle part into a given vehicle;
   tracking a number of cycles of the given instance of the vehicle part based on operations of the given vehicle in which the given instance of the vehicle part is installed; and
   in response to the number of cycles of the given instance of the vehicle part satisfying the removal threshold, transmitting a service alert to an operator of the given vehicle.

2. The method of claim 1, wherein setting the removal threshold on the reliability curve further comprises:
   determining a number of historic removals of the vehicle part used to generate the reliability curve; and
   in response to the number of historic removals being below a predetermined setpoint, setting the removal threshold as a fixed number of cycles of the vehicle part.

3. The method of claim 1, wherein setting the removal threshold on the reliability curve further comprises:
   setting the removal threshold between a first point and a second point on the reliability curve,
   wherein the first point indicates a first number of cycles of the vehicle part at which at least a first percentage of operators historically removed the vehicle part from vehicle,
   wherein the second point indicates a second number of cycles of the vehicle part that was previously set for the removal threshold for the vehicle part, and
   setting a larger of the first point and the second point as the removal threshold.

4. The method of claim 1, further comprising:
   setting a reorder threshold based on:
      a safety stock level;
      the removal threshold;
      a lead time for the vehicle part;
      a use rate of the given vehicle; and
   in response to the number of cycles of the given instance of the vehicle part satisfying the reorder threshold, transmitting an inventory alert to the operator of the given vehicle.

5. The method of claim 1, further comprising:
   determining an intersection of the reliability curve and the removal threshold;
   comparing the intersection against an upper reliability threshold for the vehicle part; and in response to the number of cycles at the intersection being greater than the upper reliability threshold, transmitting a quality alert to the operator of the given vehicle.

6. The method of claim 1, further comprising:
determining an intersection of the reliability curve and the removal threshold;
comparing the intersection against an a lower reliability threshold for the vehicle part; and
in response to the number of cycles at the intersection being lower than the lower reliability threshold, transmitting a quality alert to the operator of the given vehicle.

7. The method of claim 1, further comprising: in response to receiving additional samples of removals of the vehicle part, re-setting the removal threshold to a different value on the reliability curve.

8. The method of claim 1, wherein the given vehicle is an aircraft.

9. A method, comprising:
generating a reliability curve for a vehicle part by:
collecting usage data regarding a plurality of instances of the vehicle part, wherein for each respective instance of the vehicle part of the plurality of instances of the vehicle part:
the usage data for the respective instance are collected at a time of removal from a vehicle associated with the respective instance,
the usage data indicate a number of travel hours accumulated by the respective instance of the vehicle part at the time of removal from the associated vehicle, and
the usage data indicate whether the respective instance of the vehicle part is in a faulted state at the time of removal from the associated vehicle;
determining a percentage of instances of the vehicle part that are in the faulted state at a plurality of numbers of travel hours; and
fitting a probability distribution function that defines the reliability curve to the usage data based on the percentage of instances of the vehicle part that are in the faulted state for each of the plurality of numbers of travel hours;
setting a removal threshold on the reliability curve based on a number of cycles for historical removals of the vehicle part and a forecasted number of cycles for removal of the vehicle part;
tracking an installation of a given instance of the vehicle part into a given vehicle;
tracking a number of travel hours of the given instance of the vehicle part based on operations of the given vehicle in which the given instance of the vehicle part is installed; and
in response to the number of travel hours of the given instance of the vehicle part satisfying the removal threshold, transmitting a service alert to an operator of the given vehicle.

10. The method of claim 9, wherein setting the removal threshold further comprises:
determining a number of historic removals of the vehicle part used to generate the reliability curve; and
in response to the number of historic removals being below a predetermined setpoint, setting the removal threshold as a fixed value of travel hours for the vehicle part.

11. The method of claim 9, wherein setting the removal threshold further comprises:
setting the removal threshold between a first point and a second point on the reliability curve,
wherein the first point indicates a first number of travel hours accumulated by the vehicle part at which at least a first percentage of operators historically removed the vehicle part from vehicle, and
wherein the second point indicates a second number of travel hours accumulated by the vehicle part that was previously set as the removal threshold for the vehicle part, and
wherein a larger of the first point and the second point is set as the removal threshold.

12. The method of claim 9, further comprising:
setting a reorder threshold based on:
a safety stock level;
the removal threshold;
a lead time for the vehicle part; and
a use rate of the given vehicle; and
in response to the number of travel hours accumulated by the given instance of the vehicle part satisfying the reorder threshold, transmitting an inventory alert to the operator of the given vehicle.

13. The method of claim 9, further comprising:
determining an intersection of the reliability curve and the removal threshold;
comparing the intersection against an upper reliability threshold for the vehicle part; and
in response to a number of cycles at the intersection being greater than the upper reliability threshold, transmitting a quality alert to an operator of the given vehicle.

14. The method of claim 9, further comprising:
determining an intersection of the reliability curve and the removal threshold;
comparing the intersection against a lower reliability threshold for the vehicle part; and
in response to a number of cycles at the intersection being lower than the lower reliability threshold, transmitting a quality alert to the operator of the given vehicle.

15. The method of claim 9, further comprising:
in response to receiving additional samples of removals of the vehicle part, re-setting the removal threshold to a different value on the reliability curve.

16. The method of claim 9, wherein the given vehicle is an aircraft.

17. A system, comprising:
a processor; and
a memory storage device, including instructions that when performed by the processor enable the processor to perform an operation comprising:
generating a reliability curve for a vehicle part;
setting a removal threshold on the reliability curve based on a number of cycles for historical removals of the vehicle part and a forecasted number of cycles for removal of the vehicle part;
tracking an installation of a given instance of the vehicle part into a given vehicle;
tracking operations of the given instance of the vehicle part based on operations of the given vehicle in which the given instance of the vehicle part is installed; and
in response to the operations of the given instance of the vehicle part satisfying the removal threshold, transmitting a service alert to the operator of the given vehicle.

18. The system of claim 17, wherein setting the removal threshold further comprises:

determining a number of historic removals of the vehicle part used to generate the reliability curve; and in response to the number of historic removals being below a predetermined setpoint, setting the removal threshold as a fixed value of operations of the given vehicle.

19. The system of claim 17, wherein setting the removal threshold further comprises:
    determining a number of historic removals of the vehicle part used to generate the reliability curve; and
    in response to the number of historic removals exceeding a predetermined setpoint:
        setting the removal threshold between a first point and a second point on the reliability curve,
            wherein the first point indicates a first number of operations of the vehicle part at which at least a first percentage of operators historically removed the vehicle part from vehicle, and
            wherein the second point indicates a second number of operations of the vehicle part at which at least a second percentage of operators historically removed the vehicle part from the vehicle that is greater than the first percentage.

20. The system of claim 17, wherein generating the reliability curve for the vehicle part further comprises:
    collecting usage data from several instances of the vehicle part at a time of removal from an associated vehicle that indicate a number of cycles accumulated by a particular instance of the vehicle part at the time of removal from the associated vehicle and whether the particular instance of the vehicle part is in a faulted state at the time of removal;
    determining percentages the vehicle part in the faulted state per number of cycles; and
    fitting a probability distribution function to the usage data based on the percentages of the vehicle part in the faulted state.

21. The system of claim 17, wherein generating the reliability curve for the vehicle part further comprises:
    collecting usage data from several instances of the vehicle part at a time of removal from an associated vehicle that indicate a number of travel hours accumulated by a particular instance of the vehicle part at the time of removal from the associated vehicle and whether the particular instance of the vehicle part is in a faulted state at the time of removal;
    determining percentages the vehicle part in the faulted state per hours of travel; and
    fitting a probability distribution function to the usage data based on the percentages of the vehicle part in the faulted state.

22. The system of claim 17, wherein the operations of the vehicle part are tracked based on a number of cycles of the vehicle part while the vehicle part is installed, further comprising:
    setting a reorder threshold based on:
        the removal threshold;
        a lead time for the vehicle part;
        a use rate of the given vehicle; and
        a cycles per flight coefficient for the vehicle part; and
    in response to the operations of the given instance of the vehicle part satisfying the reorder threshold, transmitting an inventory alert to an operator of the given vehicle.

23. The system of claim 17, wherein the operations of the vehicle part are tracked based on a number of travel hours of the given vehicle while the vehicle part is installed, further comprising:
    setting a reorder threshold based on:
        the removal threshold;
        a lead time for the vehicle part; and
        a use rate of the given vehicle; and
    in response to the operations of the given instance of the vehicle part satisfying the reorder threshold, transmitting an inventory alert to an operator of the given vehicle.

24. The system of claim 17, wherein the operation further comprises:
    determining an intersection of the reliability curve and the removal threshold;
    comparing the intersection against an upper reliability threshold and a lower reliability threshold for the vehicle part; and
    in response to a number of operations of the vehicle part at the intersection being one of greater than of the upper reliability threshold or less than the lower reliability threshold, transmitting a quality alert to an operator of the given vehicle.

25. The system of claim 17, wherein the given vehicle is an aircraft.

* * * * *